United States Patent [19]
Fergus

[11] Patent Number: 5,302,868
[45] Date of Patent: Apr. 12, 1994

[54] METHOD AND APPARATUS FOR PROVIDING A REPRESENTATION OF AN INPUT VOLTAGE AT A DISABLED VOLTAGE MULTIPLIER'S OUTPUT

[75] Inventor: George H. Fergus, Schaumburg, Ill.

[73] Assignee: Motorola, Inc., Schaumburg, Ill.

[21] Appl. No.: 100,402

[22] Filed: Aug. 2, 1993

[51] Int. Cl.[5] .......................... H03F 1/32; H03F 3/04; H03F 1/26

[52] U.S. Cl. .................................. 307/491; 307/494; 330/252; 330/260

[58] Field of Search ................ 330/252, 260; 307/494, 307/491

[56] References Cited

U.S. PATENT DOCUMENTS 4,517,525 5/1985 Dijkmas et al. ..................... 330/260
5,057,716 10/1991 Kung ................................... 307/494

Primary Examiner—William L. Sikes
Assistant Examiner—Fetsum Abraham
Attorney, Agent, or Firm—Timothy W. Markison

[57] ABSTRACT

A voltage multiplier includes input and output differential multiplying stages, first and second operational amplifiers, and first and second linear devices. An input voltage is received by an inverting input of the first operational amplifier via the first linear device. An output of the voltage multiplier is provided at an output of the second operational amplifier. When the voltage multiplier is disabled, the second linear device provides the input voltage a linear path to an inverting input of the second operational amplifier and, when the voltage multiplier is operational, the second linear device has negligible effect on the voltage multiplier.

11 Claims, 1 Drawing Sheet

METHOD AND APPARATUS FOR PROVIDING A REPRESENTATION OF AN INPUT VOLTAGE AT A DISABLED VOLTAGE MULTIPLIER'S OUTPUT

FIELD OF THE INVENTION

This invention relates generally to analog multipliers and, in particular, to a disabled voltage multiplier.

BACKGROUND OF THE INVENTION

Analog multipliers are known to provide multiplication of an input AC voltage or current. Multipliers generally include a pair of differential amplifier stages which receive their respective DC bias currents from a DC power supply via matched current mirrors and are controlled by independent DC current sources located between the common node of each respective differential amplifier stage and a return of the DC power supply. An operational amplifier is typically employed to provide simultaneous control of the pair of differential amplifier stages which subsequently results in multiplication of the input current with the DC currents provided by the current sources. To produce voltage multiplication, an input voltage is provided to the input of a current multiplier via a resistor that converts the input voltage to an input current. The input current is multiplied by the current multiplier and delivered to the output of the multiplier. The output current is subsequently re-converted back to a voltage via an output operational amplifier to effectively produce voltage multiplication of the input voltage.

Multipliers are commonly used in transmitter compressors and receiver expandors to enable companding of a communication signal transmitted over a radio frequency (RF) channel with limited dynamic range. The companding operation allows wide dynamic range communication signals to be transmitted over limited dynamic range RF channels without significant reduction in the communication signals' signal-to-noise ratios. Compressors reduce, or compress, the dynamic range of the communication signal by a fractional amount dependent upon the dynamic range of the RF channel. In a complementary manner, expandors expand the dynamic range of the received communication signal such that the dynamic range of the original, pre-compressed signal is restored. For example, suppose a communication signal with 100 dB of dynamic range is to be transmitted over an RF channel with a dynamic range of 30 dB. The communication signal would require a 4:1 compression to reduce its dynamic range to 25 dB prior to transmission over the 30 dB dynamic range channel. Upon reception, a 1:4 expansion of the received communication signal would be necessary to restore the original 100 dB of dynamic range.

In most modern medium and high tier wireless and wireline communication systems, companding is a standard system function; however, in low tier, lower cost systems, companding may be an optional system addition. To reduce equipment and service costs, companding may be excluded by system proprietors that are constructing a low tier system. Accordingly, in radios or radiotelephones to be utilized in these low tier systems, compressors and expandors must be removed or bypassed. Typically, to maintain synergy and commonality with the medium and high tier radios and radiotelephones, compressors and expandors are disabled and bypassed in their respective transmitters and receivers by removing the DC power from the multiplier and using analog switching circuitry to reroute the communication signal around the compressor or expandor. However, this switching circuitry requires a significant number of additional circuit components when implemented to bypass a discrete multiplier or a significant amount of additional silicon area when implemented to bypass a multiplier within an integrated circuit. The additional circuit components and silicon area often reduce reliability and limit functionality of the voltage multiplier with which they are associated.

Therefore, a need exists for a method and apparatus that provides a disabled voltage multiplier's input signal a path to the voltage multiplier's output without impacting functionality of the operational voltage multiplier and without introducing a significant number of circuit components or requiring a significant amount of silicon area in an integrated circuit.

DESCRIPTION OF A PREFERRED EMBODIMENT

Figure 1:
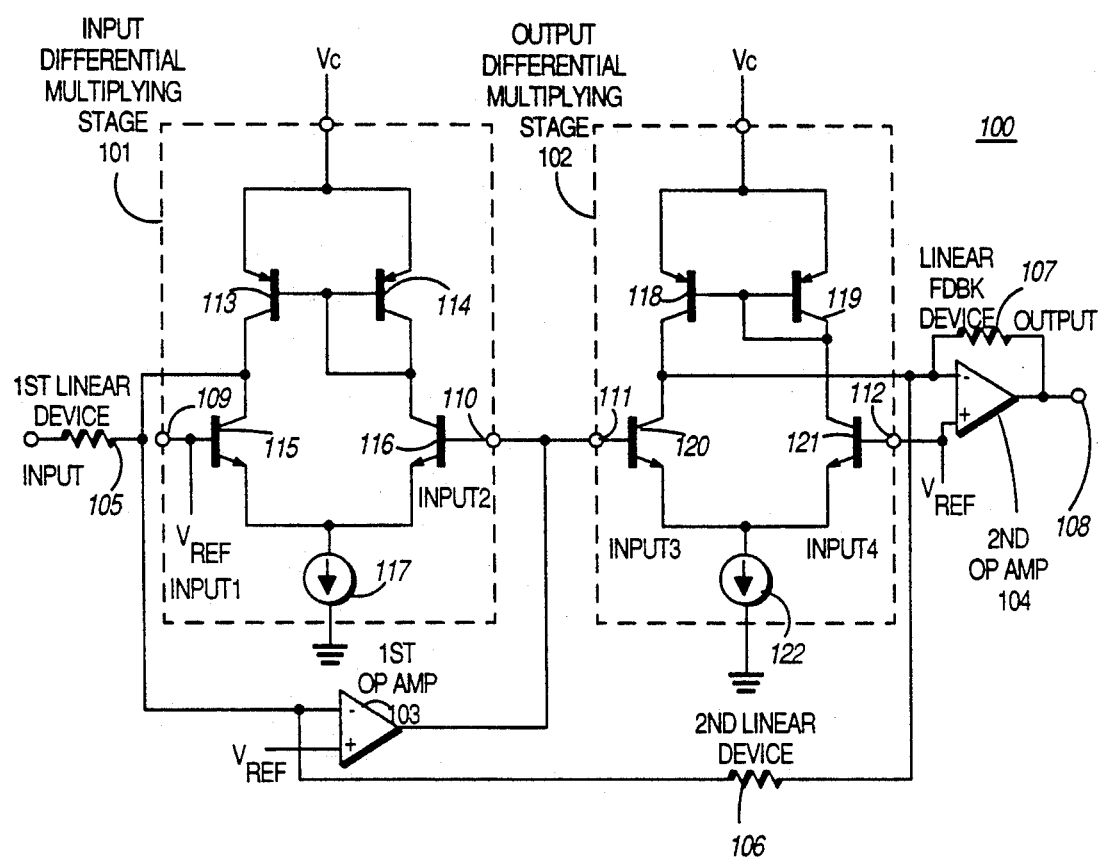
FIG. 1 illustrates a voltage multiplier in accordance with the present invention.

FIG. 1 illustrates a voltage multiplier 100 that includes input and output differential multiplying stages 101 and 102, first and second operational amplifiers 103 and 104, first and second linear devices 105 and 106, and a linear feedback device 107. The input differential multiplying stage 101 is powered by a DC supply voltage and includes a pair of biasing transistors 113 and 114, configured as a current mirror, a pair of amplifying transistors 115 and 116, and an electronically adjustable current source 117. Similarly, the output differential multiplying stage 102 is also powered by the DC power supply and includes a pair of biasing transistors 118 and 119, also configured as a current mirror, a pair of amplifying transistors 120 and 121, and an electronically adjustable current source 122. The first and second operational amplifiers 103 and 104 are generally complex devices, such as standard 741-type operational amplifiers, but may also comprise simple differential amplifiers similar to those used to implement the input and output differential multiplying stages 101 and 102. The first and second linear devices 105 and 106 and the linear feedback device 107 are depicted in FIG. 1 as resistors, but the second linear device 106 and the linear feedback device 107 may include alternative circuit elements, such as active transistor circuits which simulate resistors. Additionally, capacitors and inductors may be added in parallel, or in series, with the second linear device 106 and the linear feedback device 107 to produce a frequency dependent response to the voltage multiplier 100. The pairs of amplifying transistors 115, 116, 120, and 121 and the pairs of biasing transistors 113, 114, 118, and 119 are depicted in FIG. 1 as bipolar junction transistors, but may also comprise a variety of field-effect transistors (FETs), such as junction FETs or metal-oxide-semiconductor FETs (MOSFETs).

When operational, the voltage multiplier 100 provides multiplication of an input AC voltage by multiplying the input voltage by the ratio of the currents produced by the electronically adjustable DC current sources 117 and 122 and the ratio of the impedances provided by the linear feedback device 107 and the first linear device 105. The input voltage is converted to a current via the first linear device 105 and the current is applied to the inverting input of the first operational amplifier 103. The noninverting input of the first operational amplifier 103 is supplied with a reference voltage ($V_{REF}$). The first operational amplifier 103 and the input differential multiplying stage 101 comprise a feedback loop which stabilizes the DC voltage to $V_{REF}$ at a first input 109 of the input differential multiplying stage 101 and causes an AC voltage to appear at a second input 110 of the input differential multiplying stage 101. Because of the exponential characteristics of the pair of bipolar junction amplifying transistors 115 and 116, the AC voltage is proportional to the logarithm of the input voltage divided by the impedance of the first linear device 105 and the DC current provided by the input differential multiplying stage's current source 117. This logarithmic AC voltage is subsequently applied to a third input 111 of the output differential multiplying stage 102 which, via the pair of amplifying transistors 120 and 121, converts this logarithmic voltage to an output current that is proportional to the DC current provided by the output differential multiplying stage's current source 122. The output current is applied to the inverting input of the second operational amplifier 104 where it is converted to a voltage and provided to the voltage multiplier's output 108 (i.e. the output of the second operational amplifier 104).

The first input 109 of the input differential multiplying stage 101 is preferably connected to $V_{REF}$, but may alternatively be connected to a point of equivalent voltage potential, such as the noninverting input of the first operational amplifier 103. Similarly, a fourth input 112 of the output differential multiplying stage 102 is also connected to $V_{REF}$, but may alternatively be connected to the first input 109 of the input differential multiplying stage 101 or to the inverting input of the second operational amplifier 104.

During operation of the voltage multiplier 100, the second linear device 106 has negligible effect on the functionality of the voltage multiplier 100. The second linear device 106 remains isolated from the active elements of the voltage multiplier 100 because, during operation, the voltage potential at both of its nodes, i.e. the voltage at the inverting input of the first operational amplifier 103 and the voltage at the inverting input of the second operational amplifier 104, remains constant at $V_{REF}$ due to the negative feedback associated with the first and second operational amplifiers 103 and 104. Thus, no voltage difference exists across the second linear device 106 and, equivalently, no current flows through it.

When disabled, the voltage multiplier 100 provides a linear representation of the input voltage at its output 108. The voltage multiplier is disabled by decoupling the DC supply voltage from the input differential multiplying stage 101, the output differential multiplying stage 102, and the first operational amplifier 103. The linear representation of the input voltage is provided to the output 108 via the first and second linear devices 105 and 106 and the gain of the second operational amplifier 104. The first and second linear devices 105 and 106 provide a series path from the input of the voltage multiplier 100 to the inverting input of second operational amplifier 104. Since the second operational amplifier 104 is an inverting amplifier, its gain is proportional to the ratio of the impedance of the linear feedback device 107 divided by the sum of the impedances of the first and second linear devices 105 and 106. Therefore, the output voltage of the voltage multiplier 100 is a linear representation of the input voltage and is proportional to the gain of the second operational amplifier 104 when the voltage multiplier 100 is disabled.

By providing a linear representation of the input voltage at the output 108 of the disabled voltage multiplier 100, the present invention circumvents the limitations and circuit complexity of prior art multiplier disabling techniques. Known multiplier disabling methods do not provide a stable linear path through which the input voltage may traverse to reach the voltage multiplier's output 108 when the voltage multiplier 100 is disabled. Rather, existing techniques rely on electronically controlled switches and bypass circuitry added about the periphery of the voltage multiplier 100 to disconnect the input voltage from the disabled voltage multiplier 100 and reroute it to the output 108. This additional circuitry increases cost and decreases reliability of any equipment, such as radios or radiotelephones, that includes it.

In an alternative embodiment, the voltage multiplier 100 of FIG. 1 may comprise a portion of an integrated circuit. In this configuration, the integrated circuit includes a disable input which decouples the DC power source from the input differential multiplying stage 101, the output differential multiplying stage 102, and the first operational amplifier 103 when the voltage multiplier 100 is disabled. Thus, when the voltage multiplier 100 is disabled via the disable input, the input voltage is linearly provided to the voltage multiplier's output 108 via the first and second linear devices 105 and 106 and the second operational amplifier 104 as discussed above.

The present invention provides a method and apparatus for providing a linear representation of an input voltage at the output of a voltage multiplier when the voltage multiplier is disabled. With this invention, additional switches and bypassing circuitry of prior art solutions are not required to reroute the input voltage and provide the representation. Such switches are difficult to manufacture using the integrated circuit technology necessary to produce the exponential transistor characteristics upon which voltage multiplier technology is based. Thus, in prior art methods, external (non-integrated) complementary MOSFET (CMOS) analog switches are typically employed instead of an integrated solution. The present invention provides a reliable solution to the rerouting dilemma which may be economically implemented in either discrete or integrated form.

I claim:

1. A voltage multiplier that provides a linear representation of an input voltage when the voltage multiplier is disabled, the voltage multiplier comprises:
    an input differential multiplying stage that includes a first input and a second input, wherein the first input is operably coupled to a reference voltage;
    an output differential multiplying stage that includes a third input and a fourth input, wherein the third input is operably coupled to the second input and the fourth input is operably coupled to either the first input or the reference voltage;
    a first operational amplifier, wherein the input voltage is received at an inverting input of the first operational amplifier via a first linear device, a noninverting input of the first operational amplifier is operably coupled to the reference voltage, and an output of the first operational amplifier is operably coupled to the second input and the third input;
    a second operational amplifier, wherein an inverting input of the second operational amplifier is operably coupled to an output of the output differential multiplying stage, a noninverting input of the second operational amplifier is operably coupled to the reference voltage, and an output of the second operational amplifier provides an output of the voltage multiplier; and a second linear device that is operably coupled to the inverting input of the second operational amplifier, wherein, when the voltage multiplier is disabled, the second linear device provides the input voltage a linear path to the second operational amplifier, and when the voltage multiplier is operational, the second linear device has negligible effect on the voltage multiplier.

2. In the voltage multiplier of claim 1, the second linear device comprises a resistor.

3. The voltage multiplier of claim 1 further comprises a linear feedback device that is operably coupled to the inverting input of the second operational amplifier and the output of the second operational amplifier, wherein, when the voltage multiplier is disabled, the linear representation of the input voltage provided at the output of the voltage multiplier is based on a ratio of the linear feedback device to a sum of the first linear device and the second linear device.

4. In the voltage multiplier of claim 3, the second linear device comprises a resistor.

5. In the voltage multiplier of claim 3, the linear feedback device comprises a resistor.

6. In a voltage multiplier that includes a first operational amplifier, a second operational amplifier, and at least one differential multiplying stage that has at least a first input, a second input, and an output, wherein an input voltage is received by an inverting input of the first operational amplifier via a first linear device and wherein an inverting input of the second operational amplifier is operably coupled to the output of the at least one differential multiplying stage, a method for providing a linear representation of the input voltage when the voltage multiplier is disabled, the method comprises the steps of:
 a) when the voltage multiplier is operational, biasing a noninverting input of the first operational amplifier with a reference voltage;
 b) biasing a noninverting input of the second operational amplifier with the reference voltage; and
 c) coupling the inverting input of the first operational amplifier to the inverting input of the second operational amplifier via a second linear device, wherein, when the voltage multiplier is disabled, the input voltage is linearly provided to the inverting input of the second operational amplifier via the second linear device, and when the voltage multiplier is operational, the second linear device has negligible effect on the voltage multiplier.

7. An integrated circuit that includes a voltage multiplier, wherein the voltage multiplier substantially provides multiplication of an input voltage when the voltage multiplier is operational and provides a linear representation of the input voltage when the voltage multiplier is disabled and wherein the integrated circuit receives power from a power source, the integrated circuit comprises:

an input differential multiplying stage that includes a first input and a second input, wherein the first input is operably coupled to a reference voltage;

an output differential multiplying stage that includes a third input and a fourth input, wherein the third input is operably coupled to the second input and the fourth input is operably coupled to either the first input or the reference voltage;

a first operational amplifier, wherein the input voltage is received at an inverting input of the first operational amplifier via a first linear device, a noninverting input of the first operational amplifier is operably coupled to the reference voltage, and an output of the first operational amplifier is operably coupled to the second input and the third input;

a second operational amplifier, wherein an inverting input of the second operational amplifier is operably coupled to an output of the output differential multiplying stage, a noninverting input of the second operational amplifier is operably coupled to the reference voltage, and an output of the second operational amplifier provides an output of the voltage multiplier;

a disable input, wherein the disable input decouples the power source from the input differential multiplying stage, the output differential multiplying stage, and the first operational amplifier when the voltage multiplier is disabled; and a second linear device that is operably coupled to the inverting input of the second operational amplifier and the inverting input of the first operational amplifier, wherein, when the voltage multiplier is disabled, the second linear device provides the input voltage a linear path to the second operational amplifier, and when the voltage multiplier is operational, the second linear device has negligible effect on the voltage multiplier.

8. In the integrated circuit of claim 7, the second linear device comprises a resistor.

9. The integrated circuit of claim 7 further comprises a linear feedback device that is operably coupled to the inverting input of the second operational amplifier and the output of the second operational amplifier, wherein, when the voltage multiplier is disabled, the linear representation of the input voltage provided at the output of the voltage multiplier is based on a ratio of the linear feedback device to a sum of the first linear device and the second linear device.

10. In the integrated circuit of claim 9, the second linear device comprises a resistor.

11. In the integrated circuit of claim 9, the linear feedback device comprises a resistor.

* * * * *